(12) United States Patent
Chaichanavong

(10) Patent No.: US 9,419,653 B1
(45) Date of Patent: Aug. 16, 2016

(54) SYSTEMS AND METHODS FOR COMBINING CONSTRAINED CODES AND ERROR CORRECTING CODES

(71) Applicant: Marvell International Ltd., Hamilton (BM)

(72) Inventor: Panu Chaichanavong, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 31 days.

(21) Appl. No.: 13/802,490

(22) Filed: Mar. 13, 2013

Related U.S. Application Data

(60) Provisional application No. 61/610,849, filed on Mar. 14, 2012, provisional application No. 61/615,163, filed on Mar. 23, 2012, provisional application No. 61/653,581, filed on May 31, 2012.

(51) Int. Cl.
*H03M 13/00* (2006.01)
*H03M 13/29* (2006.01)

(52) U.S. Cl.
CPC .................................... *H03M 13/29* (2013.01)

(58) Field of Classification Search
CPC ............ G06F 12/1063; G06F 12/1009; G06F 12/145; G06F 11/1044; G06F 11/1068; H03M 13/29
USPC .......... 380/261; 714/755, 786, 782, 758, 784; 341/58–59
See application file for complete search history.

(56) References Cited

U.S. PATENT DOCUMENTS

| | | | | |
|---|---|---|---|---|
| 5,022,031 A | * | 6/1991 | Baggen | 714/793 |
| 6,029,264 A | * | 2/2000 | Kobayashi et al. | 714/755 |
| 6,513,141 B1 | * | 1/2003 | Livingston | 714/792 |
| 2008/0144833 A1 | * | 6/2008 | Matsumoto | 380/278 |

* cited by examiner

*Primary Examiner* — Guy Lamarre

(57) ABSTRACT

Methods and systems are provided for encoding and/or decoding data based on a constrained code and an error correction code (ECC). The data is encoded to generate combined LDPC-constrained codewords that may substantially satisfy both an ECC structure condition and a constrained code condition. A first plurality of sequences may be generated from input data to satisfy the constrained code condition. The first plurality of sequences may then be mapped to a second plurality of sequences that satisfies the ECC condition while preserving the constrained code condition.

20 Claims, 7 Drawing Sheets

SYSTEMS AND METHODS FOR COMBINING CONSTRAINED CODES AND ERROR CORRECTING CODES

CROSS-REFERENCE TO RELATED APPLICATIONS

This application claims the benefit under 35 U.S.C. §119(e) of U.S. Provisional Application No. 61/610,849, filed Mar. 14, 2012, U.S. Provisional Application No. 61/615,163, filed Mar. 23, 2012, and U.S. Provisional Application No. 61/653,581, filed May 31, 2012, each of which is hereby incorporated by reference herein in its entirety.

FIELD OF USE

The present disclosure relates generally to systems and methods for encoding and decoding data, and more particularly to systems and methods for encoding and decoding data using constrained codes and error correction codes.

BACKGROUND OF THE DISCLOSURE

Different codes can be used to encode data to achieve different results. One class of codes, called constrained codes, can be used to eliminate undesirable data patterns. A particular type of constrained code, called a Maximum Transition Run (MTR) code, can be used to guarantee a maximum number of transition spacing. MTR codes are widely used in a number of channels such as non-volatile storage drives, hard disk drives, and digital optical discs, to prevent long stretches of consecutive transitions, thus enhancing reliability.

Another class of codes, called error correction codes (ECC), may be used to detect and/or correct errors. Error correction codes are often used to correct errors that may occur during transmission or storage. Errors may occur for a number of reasons, including, for example, noise or interference, scratches on a physical storage medium, and/or other reasons. One type of ECC is known as a low density parity check (LDPC) code. An LDPC encoder receives original data and produces redundant or parity data based on the original data using a parity-check matrix H. The combination of the original data and the parity data is called an LDPC codeword. An LDPC codeword can be stored and/or communicated, during which errors may occur in the codeword, as described above. An LDPC decoder can process an erroneous version of an LDPC codeword to attempt to correct the errors and recover the original data.

In some applications, it may be advantageous to generate codewords using both a constrained code and an error correcting code. It is however, hard to generate codewords that are both constrained and error correcting. Existing systems attempt to approximately accomplish this goal using two common approaches.

The first approach uses two constrained encoding/decoding operations. According to this first approach, user data is encoded with a first constrained encoding operation to generate constrained data. The constrained data is then encoded with an ECC encoder to generate parity information. However, because the parity information might not satisfy the constrained code conditions, the parity information is encoded with a second constrained encoder operation. The second constrained code operation typically has a much lower code rate than the first constrained code operation. This is because, on the decoder side, the constrained parity information needs to be decoded prior to being corrected by the ECC decoder. Consequently, in an attempt to limit error propagation for the constrained parity information, low-rate codes are used. The drawback of this approach is therefore that a constrained decoder must first decode the transmitted data, and the constrained decoder typically either has a low rate or propagates errors.

Another common approach for combining constrained codes and ECC is to interleave ECC parity among constrained data. This approach typically constructs a codeword by separately generating constrained data and parity information from the same user data, and then interleaving the parity information among the constrained data. Although this approach has the advantage of running the ECC decoder first, which limits error propagation, it has the drawback that portions of the transmitted data may not be constrained.

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

SUMMARY OF THE DISCLOSURE

In accordance with some embodiments, there are provided methods and systems for encoding and decoding data based on a constrained code and an error correction code (ECC). Combined ECC-constrained codewords may be generated that substantially satisfy both an ECC structure condition and a constrained code condition.

In some embodiments, a first portion of the data is encoded based on a constrained code to provide a first constrained sequence. An error correction syndrome is computed from the first constrained sequence and a first portion of the ECC. A second portion of the data is encoded based on the constrained code, the computed error correction syndrome, and a second portion of the ECC, to generate a second constrained sequence. A concatenation of the first and second constrained sequences forms at least a portion of an ECC codeword.

In some implementations, the ECC includes a low-density parity check (LDPC) code, where the first portion of the ECC includes a first submatrix of the LDPC code and the second portion of the ECC includes a second submatrix of the LDPC code. The second constrained sequence corresponds to the second submatrix of the LDPC code.

In some implementations, encoding the second portion of the data includes encoding the second portion of data based on the constrained code to generate a third constrained sequence; and mapping the third constrained sequence to the second constrained sequence based on the computed error correction syndrome and the second portion of the ECC code.

In some implementations, another error correction syndrome is computed from the first constrained sequence and a third portion of the ECC. A parity value may also be computed corresponding to the third portion of the ECC.

In some implementations, a precoded version of the second constrained sequence is computed. The syndrome value is computed based on the computed precoded version of the second constrained sequence.

In some implementations, the concatenation of the first and second constrained sequences is transmitted, where the concatenation is decoded using ECC decoding circuitry to generate corrected sequences and the generated corrected sequences are decoded using constrained decoding circuitry to generate user data.

In some embodiments, a system is provided for encoding data, the system including encoding circuitry. The encoding circuitry is configured for encoding a first portion of the data based on a constrained code to provide a first constrained sequence; computing an error correction syndrome based on the first constrained sequence and a first portion of an error correction code (ECC); and encoding a second portion of the data based on the constrained code, the computed error correction syndrome, and a second portion of the ECC, to generate a second constrained sequence. A concatenation of the first and second constrained sequences forms at least a portion of an ECC codeword.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

The systems and methods of this invention generally relate to detecting and/or correcting errors associated with the communication and/or storage of data. As used herein, "information" and "data" refer to any unit or aggregate of energy, signals, or values that contain some meaning or usefulness. In general, a "channel" refers to a medium on which a data-bearing signal is communicated and/or stored, as well as events that may physically affect the medium. Various aspects of a channel may corrupt data that is communicated or stored thereon, and the data recovered subsequent to communication or storage may be different from their intended values. Such differences are referred to herein as "errors." The systems and methods described herein employ data encoding and decoding to mitigate the occurrences of errors in data. "Encoding" generally refers to the process of generating data in a manner that facilitates subsequent detection and/or correction of errors in the data, and "decoding" generally refers to the counterpart process of detecting and/or correcting the errors. The elements of a coding system that perform encoding and decoding are likewise referred to as encoders and decoders, respectively.

Figure 1:
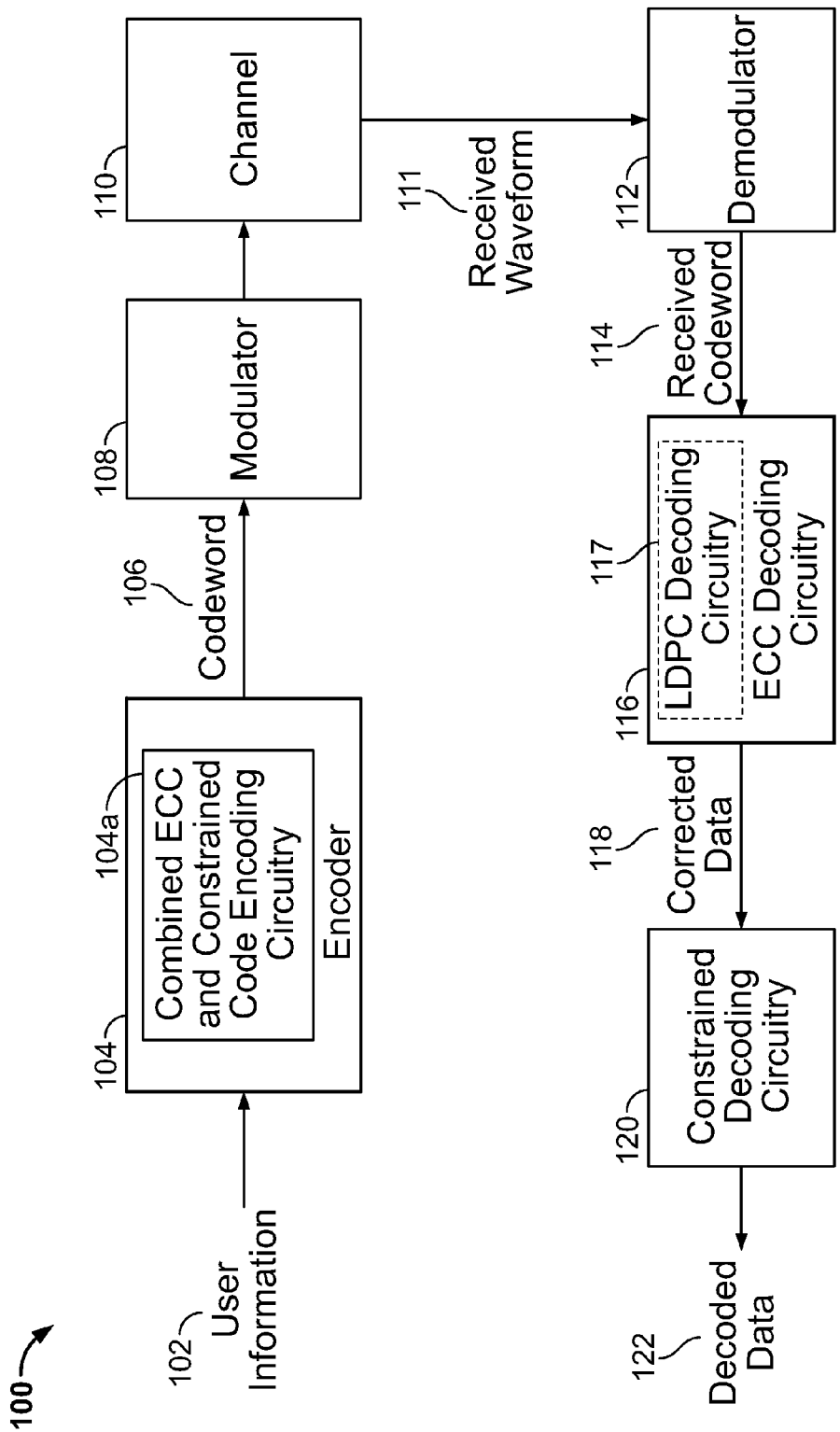
FIG. 1 shows an illustrative communication or data storage system that utilizes encoding/decoding based on constrained codes and error correction codes in accordance with some embodiments.

FIG. 1 shows an illustrative communication or data storage system 100 that utilizes encoding based on constrained codes and error correction codes for achieving reliable communication or storage in accordance with some embodiments. User information 102 is encoded using encoder circuitry 104. User information 102 may be referred to as the message information or a message vector, may be grouped into units of k symbols, where each symbol is any suitable binary or non-binary representation of information. The result of encoding user information 102 is codeword 106.

Codeword 106 may be passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 may then be processed by ECC decoding circuitry 116. ECC decoding circuitry 116 may be used to correct or detect errors in received vector 114 to generate corrected data 118. ECC decoder 116 may include LDPC decoder circuitry 117. Constrained decoding circuitry 120 processes the corrected data 118 to generate decoded data 122.

One way to prevent certain errors from occurring is to exclude certain error-prone code patterns from being used. For example, encoder 104 may include constrained code encoding circuitry to generate constrained codewords. A constrained code encoder produces codewords that satisfy certain, usually predetermined, constraints. For example, the number of consecutive transitions in the encoded data can be limited. Such constraints will be referred to herein as Maximum-transition-run (MTR) constraints.

Two different formats of writing data correspond to the Non-Return-to-Zero (NRZ) format and the Non-Return-to-Zero-Inverse (NRZI) format. The NRZ value of a bit can be 0 or 1. For example, in a magnetic disc drive, the NRZ value of the bit is 0 or 1 depending on the magnetic field direction of the bit cell on the magnetic disc. Sometimes, it can be more convenient to write data in the NRZI format, in which 1 corresponds to a polarity change between two neighboring bit cells and 0 corresponds to no polarity change. It may be undesirable to have multiple consecutive transitions in a row, or equivalently, multiple consecutive ones in the NRZI sequence of bits. One solution to this problem is to limit the number of allowed consecutive ones in the NRZI data sequence. The data encoding process that achieves this constraint is called a Maximum Transition Run (MTR) code.

Going back to the exemplary encoding circuitry of FIG. 1, encoder 104 may encode user data based on an MTR constraint to impose limits on the number of consecutive ones within codeword 106. For example, an MTR constraint of three (i.e., MTR (3)) limits the number of consecutive ones to at most three consecutive positions in codeword 106. The codeword 11001100 would be permitted under this constraint, but not 111110 or 101111. The use of constrained codes may improve the performance of exemplary communication and/or storage system 100 shown in FIG. 1.

Although the rest of this disclosure will mainly discuss MTR constraints, the systems and methods described herein apply to any suitable constrained code. Exemplary codeword constraints include but are not limited to, run-length limit (RLL) constraints, alternating RLL constraints, interleaved RLL constraints, and DC limit constraints. Although the MTR constraint is described in terms of the maximum number of consecutive ones allowed, this, again, is exemplary and not limiting. Some constraint codes apply to zeros and ones equally, while others may apply only to zeros or ones or may have different limits for each bit or symbol type.

Encoder 104 may include error correction encoding circuitry to compute parity or syndrome information based on user information 102 to generate encoded data according to a defined ECC structure.

In some implementations, the ECC used by encoder 104 may correspond to a low density parity check (LDPC) code. An LDPC code may encode k bits of user data into an n-bit codeword, where k and n are integers and n is greater than k. The difference (n-k) between n and k determines the number of bits of redundancy of the LDPC code. An LDPC code may be specified by an m-by-n binary parity-check matrix H.

In some implementations, the LDPC code implemented by encoder 104 may be structured to facilitate encoder construction. Usually, this would not significantly affect the performance of LDPC. For example, the LDPC code may have a structure similar to 250 of FIG. 2, referred to herein as double triangular. For such an exemplary double triangular LDPC code, the parity-check matrix H can be decomposed into a rectangular (including a square) submatrix A, and two lower triangular submatrices B and C. For example, submatrix B may have entries $b_{i,j}$ as follows:

$$\begin{matrix} 1 & 0 & 0 & 0 & \ldots & 0 \\ b_{2,1} & 1 & 0 & 0 & \ldots & 0 \\ b_{3,1} & b_{3,2} & 1 & 0 & \ldots & 0 \\ b_{4,1} & b_{4,2} & b_{4,3} & 1 & \ldots & 0 \\ b_{m,1} & b_{m,2} & b_{m,3} & b_{m,4} & \ldots & 1 \end{matrix}$$

Similarly, lower triangular submatrix C may have entries $c_{i,j}$ below the diagonal of ones.

Figure 3:
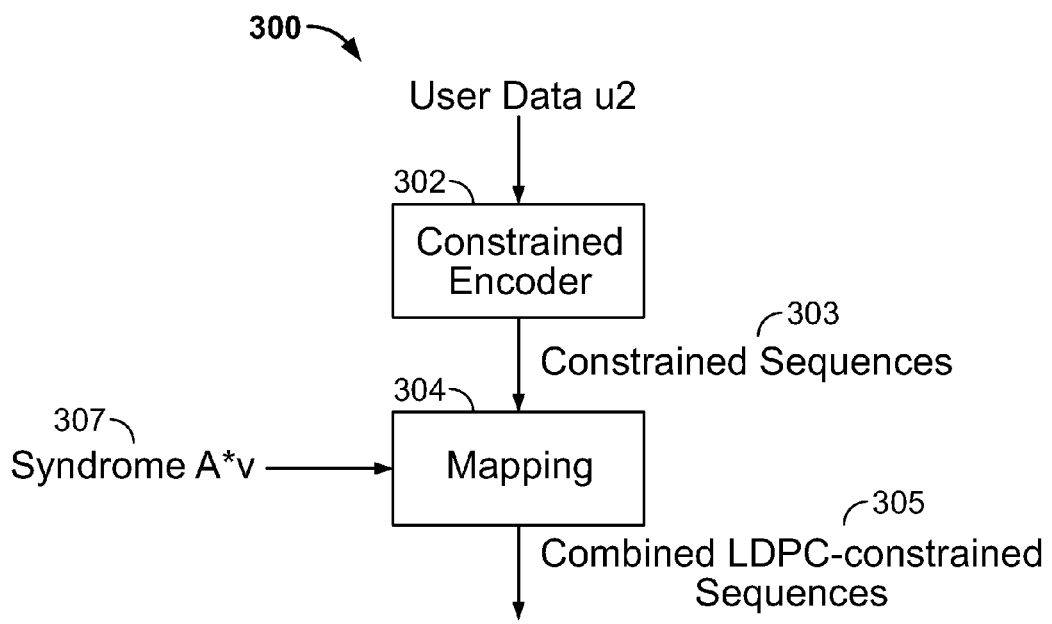
FIG. 3 shows a block diagram of an exemplary system for generating constrained sequences according to some embodiments.

In some implementations, the LDPC code may have a structure similar to 450 of FIG. 3, referred to herein as triple triangular. For such an exemplary triple triangular LDPC code, the parity-check matrix parity-check matrix H can be decomposed into a submatrix A, and three lower triangular submatrices B, C, and D. In some implementations, using a triple triangular LDPC may result in a higher code rate than a double triangular LDPC, even though it may result in additional constraints and complexity.

In some embodiments, encoder 104 includes a combined error correction code and constrained code encoding circuitry 104a, so that codeword 106 may be both a constrained codeword and an ECC codeword, i.e., a combined LDPC-constrained codeword. For example, codeword 106 output by encoding circuitry 104 may substantially comply with the constraints defined by the constrained code and be formatted according to the ECC structure. Systems and methods for encoding user data to generate such sequences that are both substantially an ECC codeword and a constrained codeword are described below.

Figure 2:
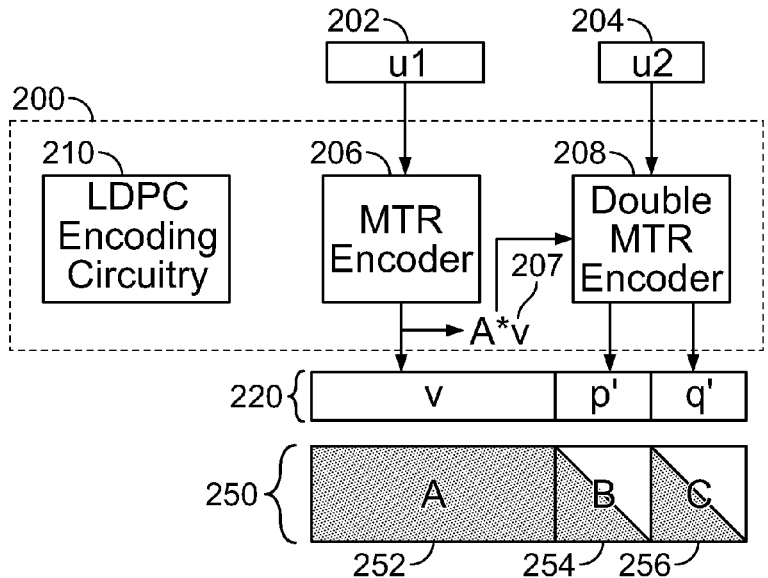
FIG. 2 shows a block diagram of an exemplary system for encoding data according to some embodiments.

FIG. 2 shows a block diagram of an exemplary system 200 for encoding data according to some embodiments. Systems 200 may be implemented in encoder circuitry such as encoder 104 of FIG. 1, to generate codewords that are both ECC and constrained, such as combined LDPC-constrained codeword 106 of FIG. 1. Encoding system 200 includes constrained encoding circuitry 206 and double constrained encoding circuitry 208 as well as LDPC encoding circuitry 210 for accessing LDPC check matrix H (labeled as 250). Although the encoding circuitry blocks 206, 208, and 210 are illustrated as separate blocks, this is meant for the purpose of illustration, not limitation. For example, LDPC encoding circuitry 210 may be implemented as part of constrained encoding circuitry 206 and/or double constrained encoding circuitry 208.

In order to generate an ECC and constrained codeword, a data word, for example, a word from user data 102 of FIG. 1, is split into two portions u1 and u2 (labeled, respectively, as 202 and 204 in FIG. 2). The data word may be any arbitrary sequence of symbols.

The first portion of data, u1, is encoded by constrained encoder 206 to generate a first constrained sequence, v. In some implementations, the length of constrained sequence v is equal to that of submatrix A from LDPC parity-check matrix H. A partial syndrome value A*v (labeled 207), corresponding to submatrix A of LDPC parity-check matrix H, is generated and input to double constrained encoding circuitry 208. This computation may be done by constrained encoding circuitry 206, LDPC encoding circuitry 210, or any other suitable circuitry.

The second portion of data, u2, is encoded by double constrained encoder 208, to generate a second and third constrained sequences p' and q'. The sequences p' and q' correspond to submatrices B and C, respectively, of LDPC parity-check matrix H. The sequences p' and q' may be generated to fulfill both the LDPC requirement and the constrained code requirement, i.e., to be combined LDPC-constrained sequences. For example, sequences p' and q' may be generated to satisfy:

(1) An LDPC Condition: in the illustrated example of FIG. 2, this condition means that codeword 220, which corresponds to the concatenation of sequences v, p', and q', i.e., [v, p', q'], is an LDPC codeword (this condition may be expressed as A*v+B*p'+C*q'=0); and (2) A Constrained Code Condition: in the illustrated example of FIG. 2, this condition means that the constrained sequences p' and q' are constrained, e.g., MTR constrained. (Because sequence v is already constrained, this condition means that codeword 220 would also be constrained.)

With respect to the constrained code condition, concatenating constrained sequences may result in a violation of the condition at the boundary between the concatenated sequences. However, the effect of such a boundary violation is generally negligible and its impact on performance minor, given the length of the codewords being processed. A codeword herein is therefore referred to as constrained and/or ECC, even in the presence of such boundary condition violations, because the codeword substantially complies with the constrained code and ECC.

Figure 9:
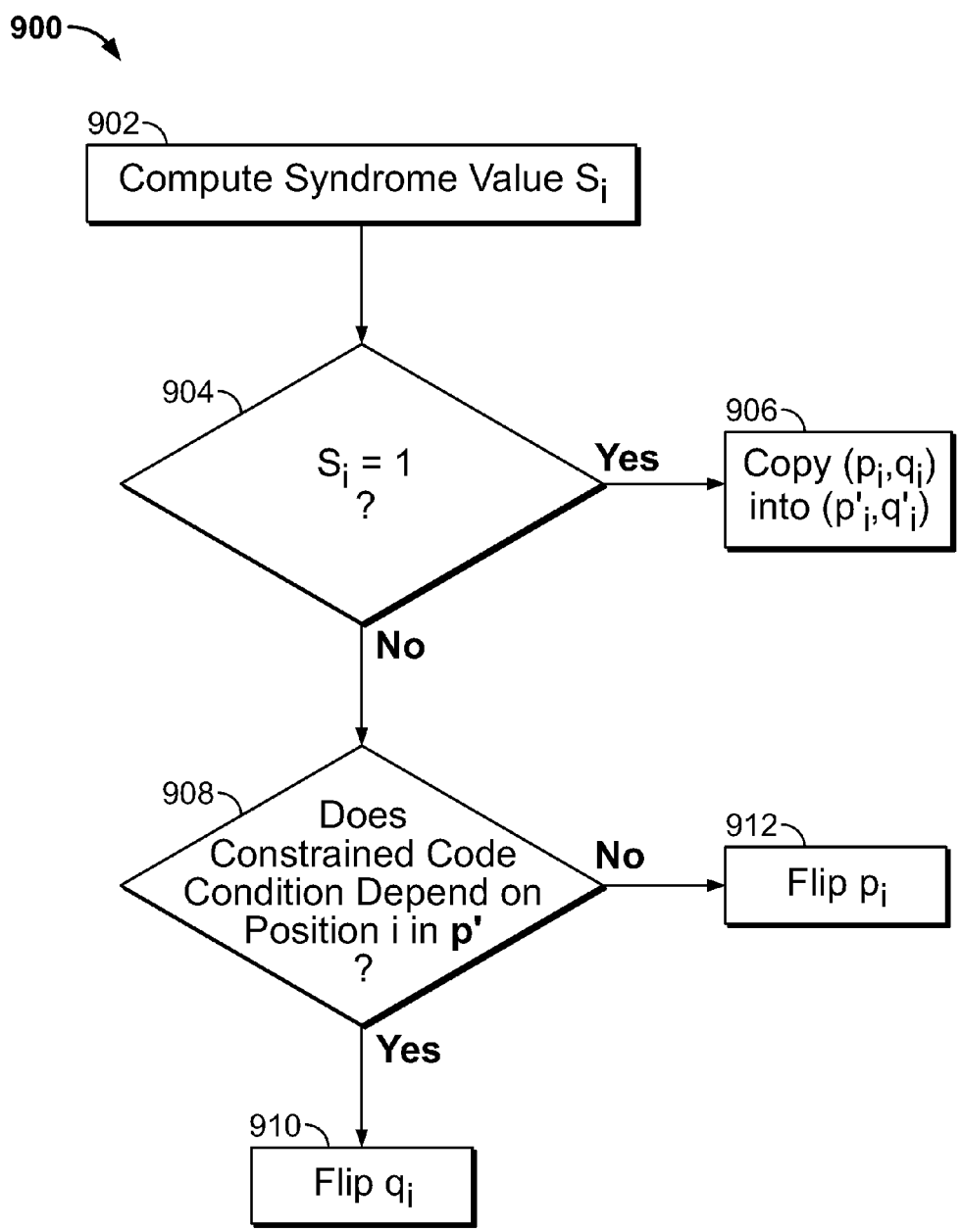
FIG. 9 shows a flowchart of a process for mapping constrained sequences to combined LDPC-constrained sequences according to some embodiments.

FIGS. 3 and 9 illustrate one way to generate LDPC-mapped constrained sequences p' and q' according to some embodiments.

FIG. 3 shows a block diagram of an exemplary system 300 for generating constrained sequences according to some embodiments. For example, system 300 may be used to implement the double constrained encoding circuitry 208 of FIG. 2. System 300 may include constrained encoder 302 and mapping block 304.

System 300 may generate LPDC-mapped constrained sequences 305, e.g., sequences p' and q', based on two operations. First, constrained encoder 302 may generate constrained sequences 303, e.g., sequences p and q, so that the constrained code condition is met. Second, mapping block 304 may map the two constrained sequences p and q to the constrained sequences p' and q' such that the LDPC condition is met while preserving the constrained code condition. This is explained in more detail below.

Constrained encoder 302 may encode the second portion of data u2 to obtain two sequences p and q such that, (1) a combination of the sequences p and q is equal to a pre-specified syndrome sequence t (e.g., p+q=t); and (2) sequences p and q are constrained, e.g., MTR-constrained.

In some implementations, the pre-specified syndrome sequence t in (1) above is computed to correspond to the syndrome that gives the smallest number of pairs of sequences (p,q) such that p+q=t. This is because, for a given sequence t, there is a certain number of pairs of sequences (p,q) such that p+q=t, and this number of pairs varies with t. Sequence t may thus be selected to correspond to the worst-case scenario, e.g., the least number of pairs (p,q). In the exemplary case of MTR, this sequence t is a string of all ones.

Mapping block 304 maps constrained sequences p and q to combined LPDC-constrained sequences p' and q' based on input A*v. This A*v may be the partial syndrome value computed using submatrix A of the LDPC check matrix as explained in FIG. 2 above. Letting w=A*v, mapping block 304 may compute, for each position i (i=1, ..., m) in sequences p and q, the following values:

(1) Syndrome value $s_i$, where $s_i = w_i + b_{i,1}*p'_1 + \ldots + b_{i,i-1}*p'_{i-1} + c_{i,1}*q'_1 + \ldots + c_{i,i-1}*q'_{i-1}$ (LDPC condition).

(2) Elements $p'_i$ and $q'_i$ from $p_i$, $q_i$, and $s_i$ such that:
$p'_i + q'_i = s_i$, and,
$[p'_1, \ldots, p'_i, p_{i+1}, \ldots, p_m]$ and
$[q'_1, \ldots, q'_i, q_{i+1}, \ldots, q_m]$ still satisfy the constraint, e.g., the MTR constraint.

Table 1 illustrates the mapping operation for i=3. At this point, the mapper block 304 may have already computed the first two elements of each of the mapped combined LPDC-constrained sequences $p'_1, p'_2, q'_1$, and $q'_2$. Mapper block 304 may compute the third element of each of the mapped combined LPDC-constrained sequences, i.e., $p'_3$ and $q'_3$, such that:

(1) $p'_3$ and $q'_3$ satisfy the $3^{rd}$ LDPC check equation, i.e., $p'_3 + q'_3 = s_i = w_3 + b_{3,1}*p'_1 + b_{3,2}*p'_2 + c_{3,1}*q'_1 + c_{3,2}*q'_2$; and (2) $[p'_1\ p'_2\ p'_3\ p_4]$ and $[q'_1\ q'_2\ q'_3\ q_4]$ satisfy the constrained code, e.g., the MTR constraint.

TABLE 1

Mapping example

| | $p'_1$ | $p'_2$ | $p_3$ | $p_4$ | $q'_1$ | $q'_2$ | $q_3$ | $q_4$ |
|---|---|---|---|---|---|---|---|---|
| $w_1$ | 1 | 0 | 0 | 0 | 1 | 0 | 0 | 0 |
| $w_2$ | $b_{2,1}$ | 1 | 0 | 0 | $c_{2,1}$ | 1 | 0 | 0 |
| $w_3$ | $b_{3,1}$ | $b_{3,2}$ | 1 | 0 | $c_{3,1}$ | $c_{3,2}$ | 1 | 0 |
| $w_4$ | $b_{4,1}$ | $b_{4,2}$ | $b_{4,3}$ | 1 | $c_{4,1}$ | $c_{4,2}$ | $c_{4,3}$ | 1 |

FIG. 9 shows a flowchart of a process 900 for mapping constrained sequences to combined LDPC-constrained sequences according to some embodiments. Process 900 may be used by encoding circuitry, such as mapper block 304 of constrained code encoding circuitry 208 of FIG. 2, to map constrained sequences p and q to combined LPDC-constrained sequences p' and q', respectively. The elements described in FIG. 9 refer to one position i in the sequences (i=1, ..., m) and may be repeated for one or more of the positions of the sequences.

At 902, syndrome value $s_i$ is computed for an $i^{th}$ element of the sequences, e.g., as described above based on the partial syndrome value w=A*v. For example, syndrome value $s_i$ may be computed based on an LDPC check matrix H, using equation $s_i = w_i + b_{i,1}*p'_1 + \ldots + b_{i,i-1}*p'_{i-1} + c_{i,1}*q'_1 + \ldots + c_{i,i-1}*q'_{i-1}$.

At 904, it is determined whether the computed syndrome value $s_i$ is equal to 1. If $s_i$ is determined to be equal to 1, then at 906 the LDPC-mapped pair $(p'_i, q'_i)$ is set to the same value as that of pair $(p_i, q_i)$.

Alternatively, if $s_i$ is determined to not be equal to 1 (e.g., is equal to 0), then the mapping process 900 flips one bit from pair $(p_i, q_i)$ to determine pair $(p'_i, q'_i)$, as explained in 908, 910, and 912.

At 908, it is determined whether the constrained code condition depends on position i in sequence p', e.g., whether setting $p'_i$ to 1 violates the constraints imposed by the constrained code. In the example of MTR(3), this is done by determining if the MTR(3) condition is violated by the concatenation of (1) bits preceding the position i in the LDPC-mapped constrained sequence p', (2) $p'_i=1$, and (3) bits succeeding the position i in the constrained sequence p. That is, if the sequence $[p'_1, \ldots, p'_{i-1}, p'_i=1, p_{i+1}, \ldots, p_m]$ violates the MTR(3) constraint (i.e., has more than three consecutive ones), then it is determined that the constrained code condition depends on position i in sequence p'.

If the constrained code condition does not depend on position i in sequence p', then at 912, $p_i$ is flipped and $q_i$ is kept the same. That is, $(p'_i, q'_i) = (p_i \wedge 1, q_i)$, where ^ denotes bitwise XOR.

Alternatively, if the constrained code condition depends on position i in sequence p', then at 910, $q_i$ is flipped and $p_i$ is kept the same. That is, $(p'_i, q'_i) = (p_i, q_i \wedge 1)$.

Figure 4:
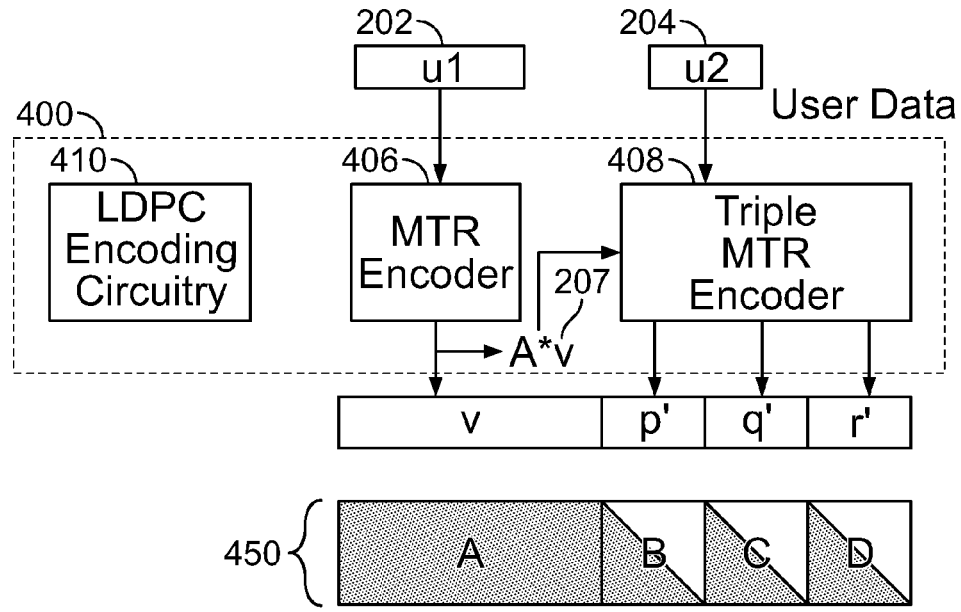
FIG. 4 is a block diagram of an exemplary system for encoding data according to some embodiments.

FIG. 4 is a block diagram of an exemplary system 400 for encoding data according to some embodiments. FIG. 4 is similar to FIG. 2, except that the implemented LDPC is triple triangular rather than double triangular. System 400 is therefore similar to system 200 of FIG. 2, except that block 408 is a triple constrained code encoding circuitry and generates three constrained sequences, rather than the double constrained code encoding circuitry 208 that generates 2 constrained sequences in FIG. 2. Like system 200, system 400 may be implemented in encoder circuitry such as encoder 104 of FIG. 1, to generate codewords that are both ECC and constrained, i.e., combined LDPC-constrained codewords. In addition to triple constrained code encoding circuitry 408, encoding system 400 includes constrained encoding circuitry 406 (which may be similar to circuitry 206 of FIG. 2) as well as LDPC encoding circuitry 410 (similar to LDPC encoding circuitry 210 of FIG. 2) for accessing LDPC check matrix H (labeled as 450). Although the encoding circuitry blocks 406, 408, and 410 are illustrated as separate blocks, this is meant for the purpose of illustration, not limitation. For example, LDPC encoding circuitry 410 may be implemented as part of constrained encoding circuitry 406 and/or constrained encoding circuitry 408.

System 400 may operate similarly to system 200, except that triple constrained encoding circuitry 408 may generate three LDPC-based constrained sequences p', q', and r' based on the LDPC and constrained code conditions. These conditions may be updated to match the triple triangular structure of the LDPC. For example, sequences p', q', and r' may be generated by encoding circuitry 408 to satisfy:

(1) An LDPC Condition: For example, codeword 420, which corresponds to the concatenation of sequences v, p', q', and r' i.e., [v, p', q', r'], is an LDPC codeword (this condition may be expressed as $A*v+B*p'+C*q'+D*r'=0$); and (2) A Constrained Code Condition: the constrained sequences p', q', and r' are constrained, e.g., MTR constrained. (Because sequence v is already constrained, this condition means that codeword 420 will also be constrained.)

Like double constrained code encoding circuitry 208, triple constrained code encoding circuitry 408 may be implemented using implementation 300 of FIG. 3. Similar to the implementation described above, system 300 may generate the LPDC-mapped constrained sequences 305, e.g., sequences p', q', and r', based on two operations. First, constrained encoder 302 may generate constrained sequences 303, e.g., sequences p, q, and r, so that the constrained code condition is met. Second, mapping block 304 may map the three constrained sequences p, q, and r to the constrained sequences p', q', and r' such that the LDPC condition is met while preserving the constrained code condition. For example, constrained encoder 302 may encode the second portion of data u2 to obtain three sequences p, q, and r such that, (3) A combination of the sequences p, q, and r is equal to a pre-specified syndrome sequence t (e.g., p+q+r=[1, 1, ..., 1]); and (4) Sequences p, q, and r are, e.g., MTR-constrained.

Mapping block 304 maps constrained sequences p, q, and r to combined LPDC-constrained sequences p', q', and r' based on partial syndrome value $A*v$. Letting $w=A*v$, mapping block 304 may compute, for each position i (i=1, ..., m) in sequences p, q, and r, sequences p', q', and r' such that $B*p'+C*q'+D*r'=A*v$.

Figure 10:
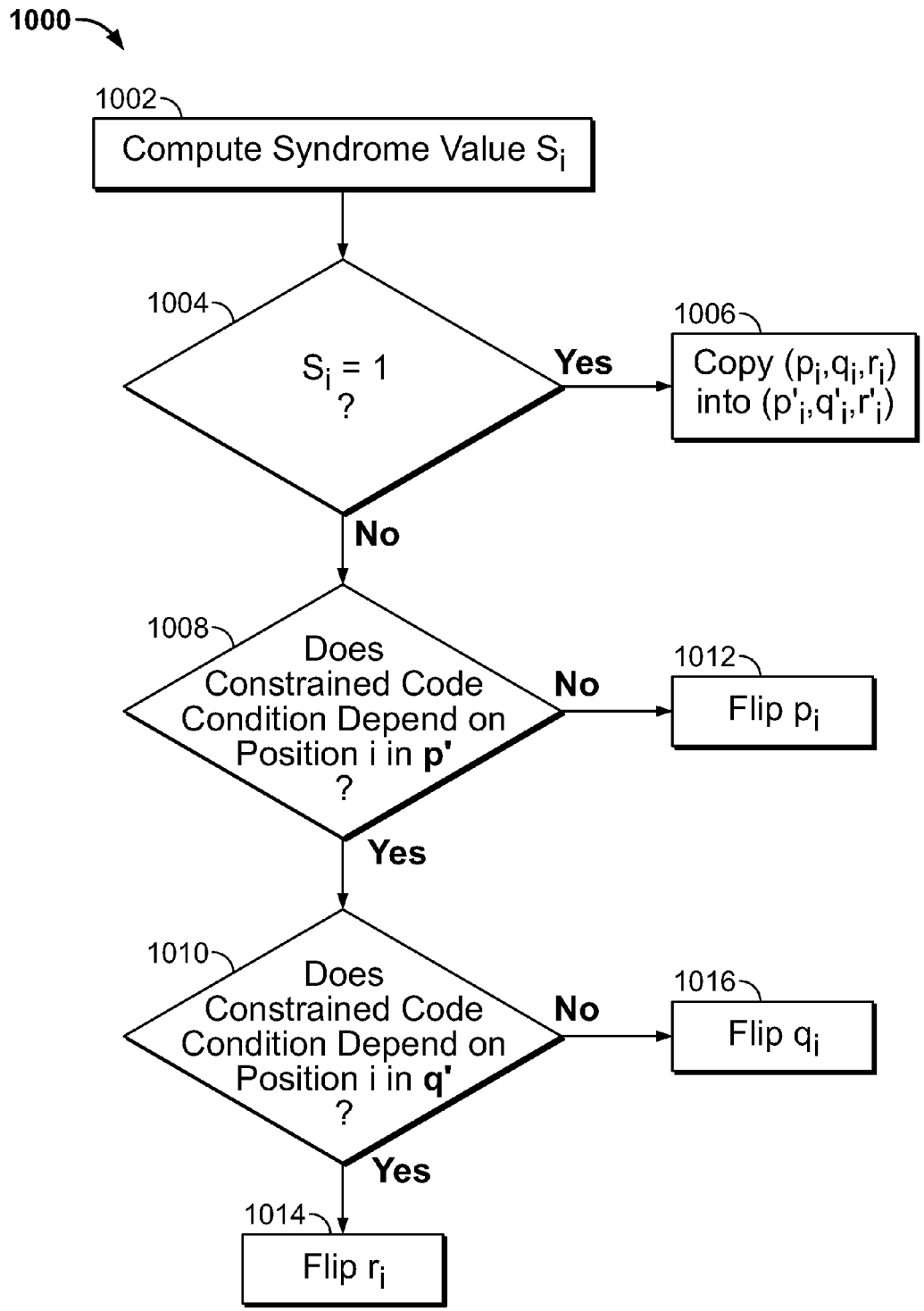
FIG. 10 shows a flowchart of a process for mapping a plurality of constrained sequences to a plurality of combined LDPC-constrained sequences, according to some embodiments.

FIG. 10 shows a flowchart of a process 1000 for mapping a plurality of constrained sequences to a plurality of combined LDPC-constrained sequences, according to some embodiments. Process 1000 may be used by encoding circuitry, such as mapper block 304 in constrained code encoding circuitry 408 of FIG. 4, to map constrained sequences p, q, and r to combined LPDC-constrained sequences p', q', and r', respectively. The steps described in FIG. 10 refer to one position i in the sequences (i=1, ..., m) and may be repeated for one or more of the positions of the sequences.

At 1002, syndrome value $s_i$ is computed, e.g., as described above using the partial syndrome value $w=A*v$. For example, syndrome value $s_i$ may be computed based on the LDPC check matrix, using equation $s_i=w_i+b_{i,1}*p'_1+\ldots+b_{i,i-1}*p'_{i-1}+c_{i,1}*q'_1+\ldots+c_{i,i-1}*q'_{i-1}d_{i,1}*r'_1+\ldots+d_{i,i-1}*r'_{i-1}$.

At 1004, it is determined whether the computed syndrome value $s_i$ is equal to 1. If $s_i$ is determined to be equal to 1, then at 1006 the LDPC-mapped triplet $(p'_i, q'_i, r'_i)$ is set to the same value as triplet $(p_i, q_i, r_i)$.

Alternatively, if $s_i$ is determined to be equal to 0, then the mapping process 1000 flips one bit from triplet $(p_i, q_i, r_i)$ to determine triplet $(p'_i, q'_i, r'_i)$ as explained in 1008, 1010, 1012, 1014, and 1016.

At 1008, it is determined whether the constrained code condition depends on position i in sequence p', e.g., whether setting $p'_i$ to 1 violates constraints imposed by the constrained code. This may be done similarly to 908 of process 900. In the example of MTR(3), this is done by determining if the MTR condition is violated by the concatenation of (1) bits preceding the position i in the combined LPDC-constrained sequence p', (2) $p'_i=1$, and (3) bits succeeding the position i in the constrained sequence p. That is, if the sequence $[p'_1, \ldots, p'_{i-1}, p'_i=1, p_{i+1}, \ldots, p_m]$ violates the MTR(3) constraint (i.e., has more than three consecutive ones), then it is determined that the constrained code condition depends on position i in the combined LPDC-constrained sequence p'.

If the constrained code condition does not depend on position i in sequence p', then at 1012, $p_i$ is flipped and $q_i$ and $r_i$ are kept the same to generate $(p'_i, q'_i, r'_i)$. That is, $(p'_i, q'_i, r'_i)=(p_i\hat{\,}1, q_i, r_i)$.

Alternatively, if the constrained code condition depends on position i in sequence p', then at 1010, it is determined whether the constrained code condition depends on position i in sequence q', e.g., whether setting $q'_i$ to 1 violates the constraints imposed by the constrained code. This may be done similarly to 1008 but with sequences q and q'.

If the constrained code condition does not depend on position i in sequence q', then at 1016, $q_i$ is flipped and $p_i$ and $r_i$ are kept the same to generate $(p'_i, q'_i, r'_i)$. That is, $(p'_i, q'_i, r'_i)=(p_i, q_i\hat{\,}1, r_i)$.

Alternatively, if the constrained code condition depends on position i in sequence q', then at 1014, $r_i$ is flipped and $q_i$ and $p_i$ are kept the same to generate $(p'_i, q'_i, r'_i)$. That is, $(p'_i, q'_i, r'_i)=(p_i, q_i, r_i\hat{\,}1)$.

The above encoding system and methods thus allow generating ECC and constrained codewords based on MTR codes and double or triple triangular LDPC codes. This, however, is meant for the purpose of illustration not limitation. The encoding systems and methods described above can be applied to other constrained codes and other ECC structures without departing from the scope of this disclosure. Exemplary structures include but are not limited to quadruple triangular LDPC codes, quintuple triangular LDPC codes, etc, as well as LDPC codes that comprise triangular sub-structures and additional components.

Figure 5:
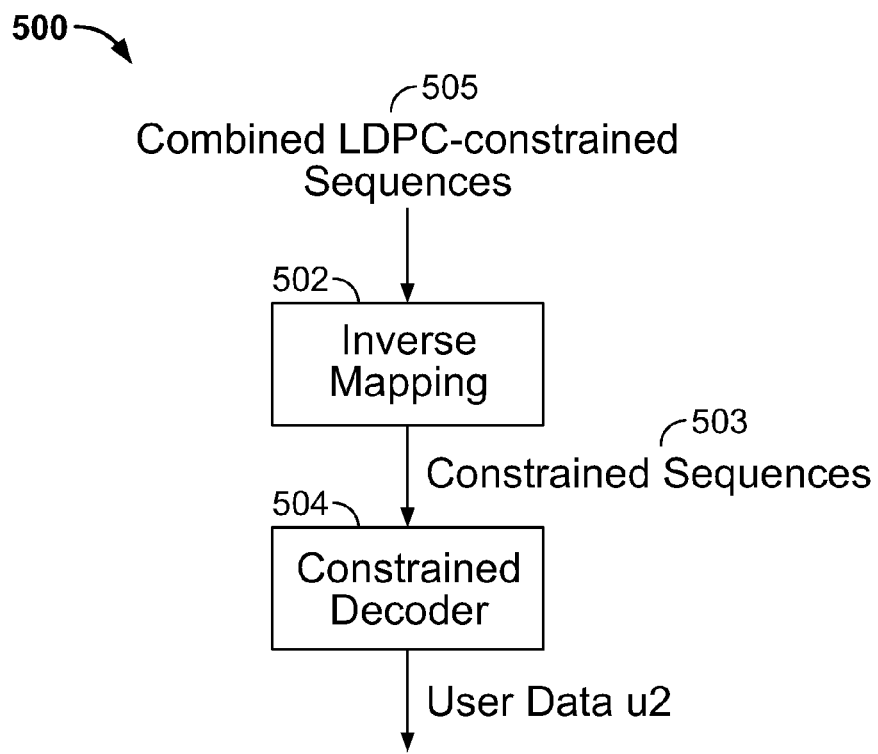
FIG. 5 illustrates an exemplary constrained code decoding circuitry for decoding constrained sequences in accordance with some embodiments.

To decode codewords generated by the systems and methods above, decoding systems and methods may be used that are arranged inversely to their corresponding encoding systems and methods. As described in FIG. 1 above, an ECC decoder 116 may first process the received codeword 114 to generate corrected data 118. In some implementations, the ECC decoder may have LDPC decoding circuitry 117 that may decode the received codeword 114 to generate a corrected codeword $[v_c, p_c', q_c', r_c']$, where subscript c denotes that the codeword has been decoded/corrected by the LDPC decoding circuitry 117. The corrected codeword may then be decoded using constrained code decoding circuitry similar to constrained code decoding circuitry 120 of FIG. 1. Constrained decoding circuitry 120 may decode corrected constrained sequence $v_c$ to recover data u1. Constrained decoding circuitry 120 may decode corrected constrained sequences $p_c'$, $q_c'$, $r_c'$ to recover data u2. FIG. 5 illustrates such constrained code decoding circuitry.

FIG. 5 illustrates an exemplary constrained code decoding circuitry 500 for decoding combined LPDC-constrained sequences according to some embodiments. Circuitry 500 includes inverse mapping block 502 and constrained code decoder 504.

Inverse mapping block 502 may receive combined LPDC-constrained sequences $p_c'$, $q_c'$, $r_c'$ as decoded by LDPC decoder such as LDPC decoding circuitry 117 of FIG. 1. These sequences $p_c'$, $q_c'$, $r_c'$ may correspond to combined LPDC-constrained sequences p', q', r' after transmission through channel 110 and demodulation through demodulator 112. LDPC decoding circuitry 117 decodes constrained sequences $p_c'$, $q_c'$, $r_c'$ based on an LDPC check equation, such as $B*p_c'+C*q_c'+D*r_c'=A*v_c$. For example, inverse mapping block 502 may demap combined LPDC-constrained sequences $p_c'$, $q_c'$, $r_c'$ into constrained sequences $p_c$, $q_c$, $r_c$ such that $p_c+q_c+r_c=1$. Constrained code decoder 504 may then decode constrained sequences $p_C$, $q_c$, and $r_c$ into data $u_c2$. This may be done using any suitable constrained code decoding operation. An example of a demapping process used by inverse mapping block 502 is illustrated in FIG. 11.

Figure 11:
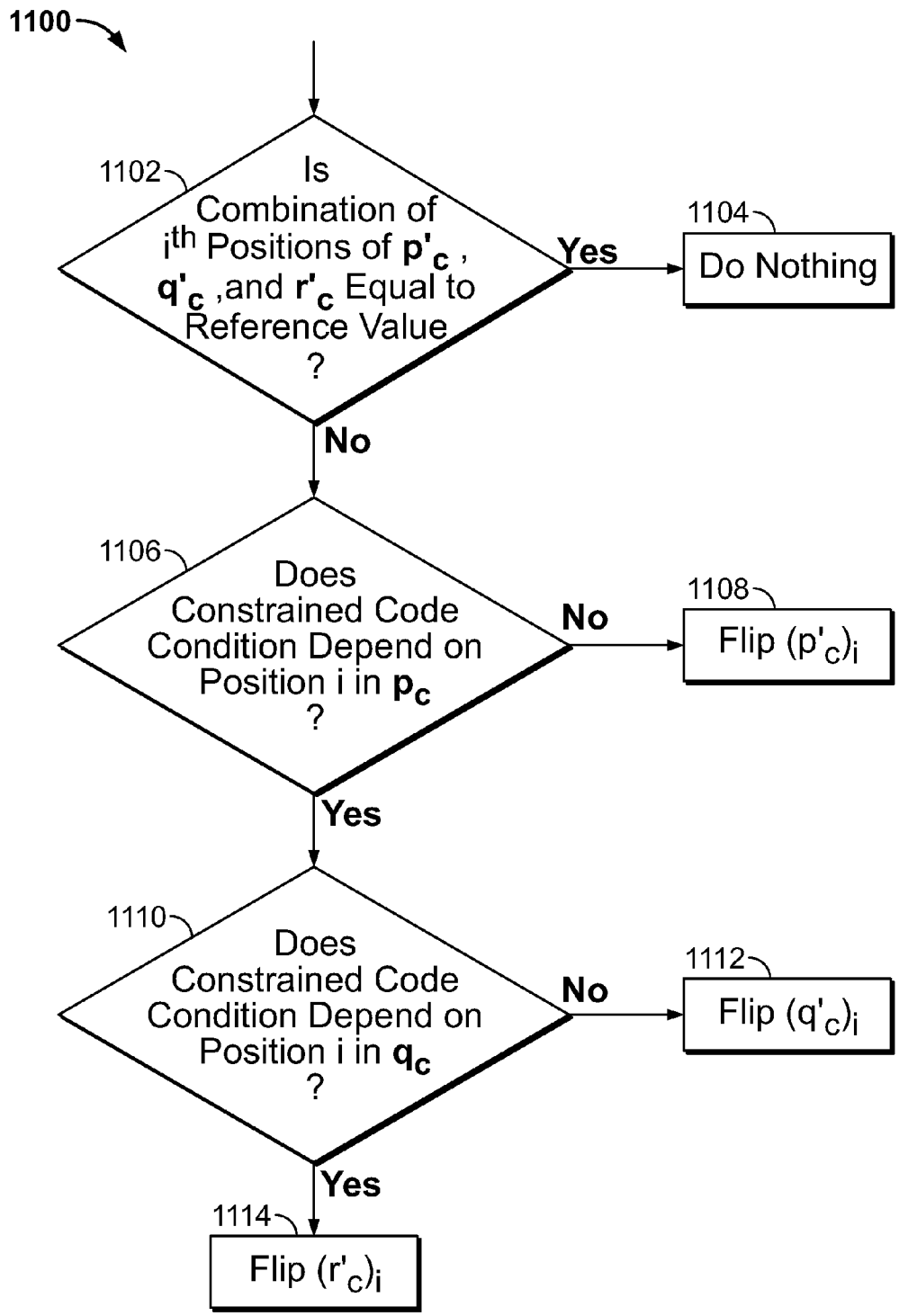
FIG. 11 shows a flowchart of a process for demapping a plurality of combined LDPC-constrained sequences to a plurality of constrained sequences according to some embodiments.

FIG. 11 shows a flowchart of a process 1100 for demapping a plurality of combined LDPC-constrained sequences to a plurality of constrained sequences according to some embodiments. Process 1100 may be used by decoding circuitry, such as demapper block 502 of constrained code decoding circuitry 120 of FIG. 1 to demap combined LPDC-constrained sequences $p_c'$, $q_c'$, $r_c'$ into constrained sequences $p_c$, $q_c$, $r_c$, respectively. The elements of FIG. 11 refer to one position i in the sequences and may be repeated for one or more of the positions of the sequences. Demapping process 1100 may be performed in reverse direction relative to aping process 1000. For example, mapping may be performed from i=1, 2, 3, . . . , m and demapping may be performed from i=m, m−1, m−2, . . . , 1.

At 1102, a combination of the $i^{th}$ positions in the corrected combined LDPC-constrained sequences (e.g., $(p_c')_i$, $(q_c')_i$, $(r_c')_i$) is computed and compared to a reference value, e.g., the combination is compared to 1. For example, if $(p_c')_i+(q_c')_i+(r_c')_i$ is equal to 1, then at 1104, $(p_c')_i$, $(q_c')_i$, $(r_c')_i$ are kept the same. That is, $((p_c)_i, (q_c)_i, (r_c)_i)=((p_c')_i, (q_c')_i, (r_c')_i)$.

Alternatively, if the combination of the $i^{th}$ positions in the corrected combined LDPC-constrained sequences (e.g., $(p_c')_i+(q_c')_i+(r_c')_i$) is not equal to the reference value (e.g., the combination is equal to 0), then at 1106, it is determined whether the constrained code condition depends on position i in sequence $p_c$, e.g., whether setting $(p_c)_i$ to 1 violates constraints imposed by the constrained code. This may be done similarly to 1008 of FIG. 10, e.g., by looking at the concatenation $[(p_c')_1, \ldots, (p_c')_{i-1}, (p_c)_i=1, (p_c)_{i+1}, \ldots, (p_c)_m]$ and evaluating whether the concatenation satisfies the constrained code.

If the constrained code condition does not depend on position i in sequence $p_c$, then at 1108, $(p_c')_i$ is flipped and $(q_c')_i$ and $(r_c')_i$ are kept the same to generate $((p_c)_i, (q_c)_i, (r_c)_i)$. That is, $((p_c)_i, (q_c)_i, (r_c)_i)=((p_c')_i\hat{} 1, (q_c')_i, (r_c')_i)$.

Alternatively, if the constrained code condition depends on position i in sequence $p_c$, then at 1110, it is determined whether the constrained code condition depends on position i in sequence $q_c$, e.g., whether setting $(q_c)_i$ to 1 violates the constraints imposed by the constrained code. This may be done similarly to 1010 of FIG. 10, e.g., by looking at the concatenation $[(q_c')_1, \ldots, (q_c')_{i-1}, (q_c)_i=1, (q_c)_{i+1}, \ldots, (q_c)_m]$ and evaluating whether the concatenation satisfies the constrained code.

If the constrained code condition does not depend on position i in sequence $q_c$, then at 1112, $(q_c')_i$ is flipped and $(p_c')_i$ and $(r_c')_i$ are kept the same to generate $((p_c)_i, (q_c)_i, (r_c)_i)$. That is, $((p_c)_i, (q_c)_i, (r_c)_i)=((p_c')_i, (q_c')_i\hat{} 1, (r_c')_i)$.

Alternatively, if the constrained code condition depends on position i in sequence $q_c$, then at 1114, $(r_c')_i$ is flipped and $(p_c')_i$ and $(q_c')_i$ are kept the same to generate $((p_c)_i, (q_c)_i, (r_c)_i)$. That is, $((p_c)_i, (q_c)_i, (r_c)_i)=((p_c')_i, (q_c')_i, (r_c')_i\hat{} 1)$.

Although the above describes decoding for a triple triangular LDPC code, this is meant for the purposes of illustration, not limitation. The decoding methods may be applied to double triangular LDPC codes or any suitable LDPC or ECC code, without departing from the scope of the disclosure. One advantage of the decoding systems and methods described above is that there may be no need to compute syndrome values, as the combination of received sequences is compared against a reference value. This may improve performance and facilitate decoder construction.

Figure 6:
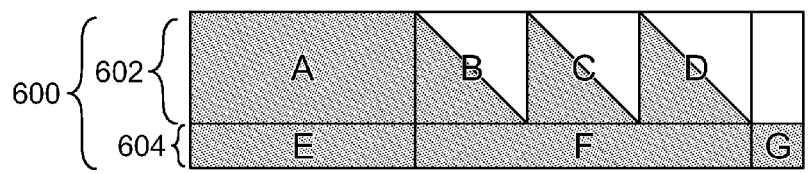
FIG. 6 is a block diagram illustrating an exemplary LDPC parity-check matrix in accordance with some embodiments.
Figure 7:
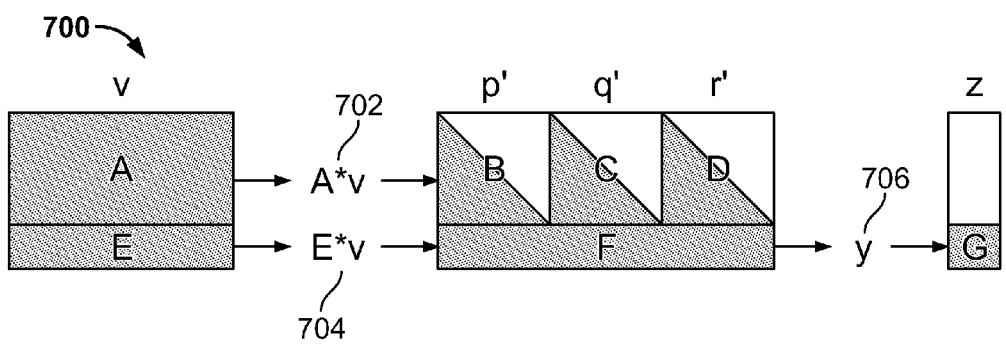
FIG. 7 illustrates a block diagram of a process for generating an updated codeword corresponding to an LDPC code such as the one illustrated in FIG. 6, in accordance with some embodiments.
Figure 8:
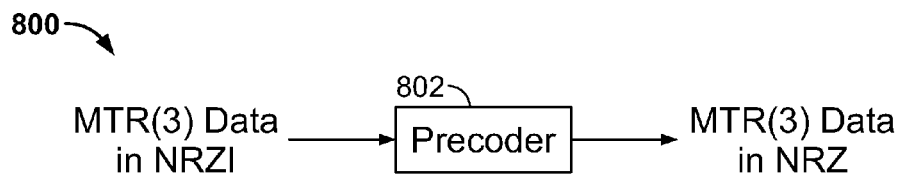
FIG. 8 shows a block diagram of a precoder 800 for converting NRZI data into NRZ data in accordance with some embodiments.

FIGS. 6, 7, and 8 illustrate variants on the described systems and methods above. FIGS. 6 and 7 illustrate embodiments with various structures of LDPC codes. FIG. 8 illustrates embodiments with a precoding component, e.g., where data is transmitted in the NRZ domain.

One important property associated with an LDPC code is referred to as column weight. This relates to the weight of a column in the parity-check matrix H corresponding to the LDPC code, which is defined as the number of ones in the column. In many applications, it is not acceptable and/or desirable for any column weight to be less than 3 (e.g., equal to 1 or 2). However, with the double or triple triangular matrix structures described above (e.g., matrix 250 of FIG. 2 and 450 of FIG. 4, respectively), some columns would have a column weight equal to 1 or 2 (e.g., the $m^{th}$ and $(m-1)^{th}$ column of submatrices B, C, and D). In order to generate LDPC codewords based on LDPC codes without such low column weights, the double or triangular lower matrix structures of the LDPC code may be changed as illustrated in FIG. 6 below.

FIG. 6 is a block diagram illustrating an exemplary LDPC parity-check matrix H (labeled as 600). Parity-check matrix H comprises submatrix 602 (triple triangular) and submatrix 604 (rectangular). Triple triangular submatrix 602 includes submatrix A and lower triangular submatrices B, C, and D. Triangular submatrix 604 includes submatrices E, F, and G. In general, the number of rows of submatrix 602 is larger than that of submatrix 604. In this way, undesirable and/or low column weights may be avoided.

To generate constrained codewords based on LDPC parity-check matrix 600, constrained codewords are first generated based on the triangular structure 602, as described in FIG. 4 above. Then parity information is generated based on the rectangular structure 604. Although the parity corresponding to submatrix G is not constrained, the parity may be interleaved into the first part (corresponding to submatrix A) or a low-rate constrained code may be used to encode/decode the constrained data.

FIG. 7 illustrates a block diagram of a process 700 for generating an updated codeword corresponding to an LDPC code such as the one illustrated in FIG. 6. This process may be implemented using LDPC encoding circuitry and constrained encoding circuitry similar to encoder 104 of FIG. 1 as follows.

First, partial syndrome values A*v (labeled 702) and E*v (labeled 704) are computed from submatrices A and E, similarly to the syndrome value computation in FIG. 4 above. These partial syndrome values may be computed in parallel, in sequence, or in any appropriate arrangement.

Second, sequences p', q', and r' are computed from submatrices B, C, D, as described above with respect to FIG. 4.

Third, an updated syndrome vector y (labeled 706) is computed based on the full-matrix structure (e.g., y=E*v+F*[p', q', r']).

Fourth, a parity vector is computed based on submatrix G of parity-check matrix H, e.g., $z=G^{-1}*y$.

To improve performance, the computation of p', q', and r' from submatrices B, C, D and of updated syndrome vector y may be performed in parallel. Moreover, $G^{-1}$ in the computation of parity vector z may be pre-computed and stored to compute z.

The methods and systems illustrated in FIGS. 6 and 7 may improve performance of LDPC and ECC encoding/decoding by splitting the LDPC code into two portions, generating combined constrained-LDPC codewords based on the first portion of the LDPC, and generating parity information based on the second portion of the LDPC. Even where the parity information based on the second portion is interleaved with the combined LDPC-constrained codewords generated based on the first portion of the LDPC code, or where the parity information is encoded using a low-rate constrained encoder, the final codewords may still be LDPC and substantially constrained. This is because the interleaving or low-rate constrained encoding may be limited to only a subset of the LDPC code, which is generally small relative to the entire LDPC code. This in turn may improve reliability.

Another variant on the systems and methods described herein include modifications to the mapping operations (e.g., the mapping operations performed by mapping block 304 of FIG. 3) to include precoding operations. For example, the methods and systems described above may generate constrained data in the NRZI domain, where 1 may mean a transition and 0 may mean no transition. Some systems and methods involve processing and transmitting data in the NRZ domain, where 1 and 0 may refer to bits values rather than transitions. In these systems, NRZI data may be converted into NRZ data using a precoder as shown in FIG. 8.

FIG. 8 shows a block diagram of a precoder 800 for converting NRZI data into NRZ data. In one example, precoder 800 precodes MTR(3) data in the NRZI domain (e.g., forbidding sequences of 4 or more ones, such as '1111') to MTR(3) data in the NRZ domain (e.g., forbidding sequences with 4 or more changes of polarity, such as sequences '01010' and '10101'). The conversion from NRZI data (that is LDPC and constrained) to NRZ data may result in the NRZ data no longer being LDPC. To correct this, the encoding systems and methods may be updated to perform the precoding operation with the operation of mapping from constrained sequences to combined LPDC-constrained sequences. For example, the mapping operations described above may be adjusted to compensate for the precoding operation.

Table 2 illustrates the mapping and precoding operation for i=3. At this point, the mapper block 304 may have already performed the mapping and precoding operations for the first two elements of each of the mapped combined LPDC-constrained sequences $x'_1$, $x'_2$, $y'_1$, and $y'_2$. As in the example explained in the context of Table 1 above, p and q may represent two sequences in the NRZI domain. Let x and y represent sequences p and q, respectively, in the NRZ domain. Sequence x' is the precoded version of p' and sequence y' is the precoded version of q', where the relationship based on the precoding operations can be expressed as $p'_k=x'_k+x'_{k-1}$ and $q'_k=y'_k+y'_{k-1}$.

Mapper block 304 may compute the third element of each of the mapped combined LPDC-constrained sequences, $x'_3$ and $y'_3$, such that:

(1) $x'_3$ and $y'_3$ satisfy the 3$^{rd}$ LDPC check equation, i.e., $x'_3+y'_3=w_3+b_{3,1}*x'_1+b_{3,2}*x'_2+c_{3,1}*y'_1+c_{3,2}*y'_2$; and (2) $[x'_1\ x'_2\ x'_3\ p_4]$ and $[y'_1\ y'_2\ y'_3\ q_4]$ satisfy the constrained code, e.g., the MTR constraint.

TABLE 2

Mapping And Precoding example

| | $x'_1$ | $x'_2$ | $p_3$ | $p_4$ | $y'_1$ | $y'_2$ | $q_3$ | $q_4$ |
|---|---|---|---|---|---|---|---|---|
| $w_1$ | 1 | 0 | 0 | 0 | 1 | 0 | 0 | 0 |
| $w_2$ | $b_{2,1}$ | 1 | 0 | 0 | $c_{2,1}$ | 1 | 0 | 0 |
| $w_3$ | $b_{3,1}$ | $b_{3,2}$ | 1 | 0 | $c_{3,1}$ | $c_{3,2}$ | 1 | 0 |
| $w_4$ | $b_{4,1}$ | $b_{4,2}$ | $b_{4,3}$ | 1 | $c_{4,1}$ | $c_{4,2}$ | $c_{4,3}$ | 1 |

By adding $x'_2+y'_2$ to both sides of the 3$^{rd}$ LDPC check equation, it can be seen that $(x'_2+x'_3)+(y'_2+y'_3)=(w_3+b_{3,1}*x'_1+b_{3,2}*x'_2+c_{3,1}*y'_1+c_{3,2}*y'_2)+x'_2+y'_2$.

$p'_3+q'_3=(w_3+b_{3,1}*x'_1+b_{3,2}*x'_2+c_{3,1}*y'_1+c_{3,2}*y'_2)+x'_2+y'_2$.

Therefore, the mapping may be done as before to get $p'_3$ and $q'_3$, but adjusting the syndrome by $x'_2+y'_2$ to perform the conversion to the NRZ domain. After mapping, $x'_3$ and $y'3$ can be obtained from $x'_2+p'_3$ and $y'_2+q'_3$. In this fashion, sequences x' and y' are generated to be both constrained and LDPC in the NRZ domain.

The above extensions are merely illustrative and other changes may be made to the systems and methods above without departing from the scope of the disclosure.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only by the claims which follow. Furthermore, the present disclosure is not limited to a particular implementation. For example, one or more steps of methods described above may be performed in a different order (parallel or concurrently) and still achieve desirable results. In addition, the disclosure may be implemented in hardware, such as on an application specific integrated circuit (ASIC) or on a programmable logic device (PLD). The disclosure may also be implemented in software or hardware.

What is claimed is:

1. A method for encoding data, comprising:
   encoding, using encoding circuitry, a first portion of the data based on a constrained code to provide a first constrained sequence;
   computing an error correction syndrome based on the first constrained sequence and a first portion of an error correction code (ECC);
   encoding a second portion of the data based on the constrained code, the computed error correction syndrome, and a second portion of the ECC, to generate a second constrained sequence,
   wherein a concatenation of the first and second constrained sequences forms at least a portion of an ECC codeword.

2. The method of claim 1, wherein the ECC comprises a low-density parity check (LDPC) code, wherein:
   the first portion of the ECC comprises a first submatrix of the LDPC code and the second portion of the ECC comprises a second submatrix of the LDPC code; and
   the second constrained sequence corresponds to the second submatrix of the LDPC code.

3. The method of claim 1, wherein said encoding the second portion of the data comprises:

encoding the second portion of data based on the constrained code to generate a third constrained sequence;
mapping the third constrained sequence to the second constrained sequence, based on the computed error correction syndrome and the second portion of the ECC code.

4. The method of claim 3, wherein said mapping comprises:
computing a syndrome value for a position i in the second constrained sequence based on the computed error correction syndrome; and
determining a symbol at the position i in the second constrained sequence from a symbol at the position i in the third constrained sequence.

5. The method of claim 4, wherein said determining a symbol at the position i in the second constrained sequence from a symbol at the position i in the third constrained sequence comprises:
determining whether a concatenation of (1) symbols preceding the position i in the second constrained sequence, (2) a particular symbol value at the position i in the second constrained sequence, and (3) symbols succeeding the position i in the third constrained sequence, complies with the constrained code.

6. The method of claim 1, further comprising:
computing another error correction syndrome from the first constrained sequence and a third portion of the ECC; and
computing a parity value corresponding to the third portion of the ECC.

7. The method of claim 6, wherein the first portion of the ECC comprises a first submatrix of the LDPC code, the second portion of the ECC comprises a plurality of triangular submatrices of the LDPC code, and the third portion of the ECC comprises a plurality of rectangular submatrices of the LDPC code.

8. The method of claim 1, comprising:
computing a precoded version of the second constrained sequence; and
adjusting the syndrome value based on the computed precoded version of the second constrained sequence.

9. The method of claim 8, wherein the second constrained sequence corresponds to the Non-Return-to-Zero (NRZ) domain and the precoded version of the second constrained sequence corresponds to the Non-Return-to-Zero-Inverted (NRZI) domain.

10. The method of claim 1, comprising transmitting the concatenation of the first and second constrained sequences, wherein:
the concatenation is decoded using ECC decoding circuitry to generate corrected sequences;
the generated corrected sequences are decoded using constrained decoding circuitry to generate user data.

11. A system for encoding data, the system comprising encoding circuitry configured for:
encoding a first portion of the data based on a constrained code to provide a first constrained sequence;
computing an error correction syndrome based on the first constrained sequence and a first portion of an error correction code (ECC);
encoding a second portion of the data based on the constrained code, the computed error correction syndrome, and a second portion of the ECC, to generate a second constrained sequence,
wherein a concatenation of the first and second constrained sequences forms at least a portion of an ECC codeword.

12. The system of claim 11, wherein the ECC comprises a low-density parity check (LDPC) code, wherein:
the first portion of the ECC comprises a first submatrix of the LDPC code and the second portion of the ECC comprises a second submatrix of the LDPC code; and
the second constrained sequence corresponds to the second submatrix of the LDPC code.

13. The system of claim 11, wherein the encoding circuitry is configured for:
encoding the second portion of data based on the constrained code to generate a third constrained sequence;
mapping the third constrained sequence to the second constrained sequence based on the computed error correction syndrome and the second portion of the ECC code.

14. The system of claim 13, wherein said mapping comprises:
computing a syndrome value for a position i in the second constrained sequence based on the computed error correction syndrome; and
determining a symbol at the position i in the second constrained sequence from a symbol at the position i in the third constrained sequence.

15. The system of claim 14, wherein said determining a symbol at the position i in the second constrained sequence from a symbol at the position i in the third constrained sequence comprises:
determining whether a concatenation of (1) symbols preceding the position i in the second constrained sequence, (2) a particular symbol value at the position i in the second constrained sequence, and (3) symbols succeeding the position i in the third constrained sequence, complies with the constrained code.

16. The system of claim 11, the encoding circuitry further configured for:
computing another error correction syndrome from the first constrained sequence and a third portion of the ECC; and
computing a parity value corresponding to the third portion of the ECC.

17. The system of claim 16, wherein the first portion of the ECC comprises a first submatrix of the LDPC code, the second portion of the ECC comprises a plurality of triangular submatrices of the LDPC code, and the third portion of the ECC comprises a plurality of rectangular submatrices of the LDPC code.

18. The system of claim 11, the encoding circuitry further configured for:
computing a precoded version of the second constrained sequence; and
adjusting the syndrome value based on the computed precoded version of the second constrained sequence.

19. The system of claim 18, wherein the second constrained sequence corresponds to the Non-Return-to-Zero (NRZ) domain and the precoded version of the second constrained sequence corresponds to the Non-Return-to-Zero-Inverted (NRZI) domain.

20. The system of claim 11, the encoding circuitry further configured for transmitting the concatenation of the first and second constrained sequences, wherein:
the concatenation is decoded using ECC decoding circuitry to generate corrected sequences;
the generated corrected sequences are decoded using constrained decoding circuitry to generate user data.

* * * * *